(12) United States Patent
Classen et al.

(10) Patent No.: US 9,169,116 B2
(45) Date of Patent: Oct. 27, 2015

(54) HYBRID INTEGRATED COMPONENT AND METHOD FOR THE MANUFACTURE THEREOF

(71) Applicants: Johannes Classen, Reutlingen (DE); Paul Farber, Budapest (HU)

(72) Inventors: Johannes Classen, Reutlingen (DE); Paul Farber, Budapest (HU)

(73) Assignee: ROBERT BOSCH GMBH, Stuttgart (DE)

( * ) Notice: Subject to any disclaimer, the term of this patent is extended or adjusted under 35 U.S.C. 154(b) by 162 days.

(21) Appl. No.: 13/916,094

(22) Filed: Jun. 12, 2013

(65) Prior Publication Data

US 2013/0334621 A1 Dec. 19, 2013

(30) Foreign Application Priority Data

Jun. 14, 2012 (DE) .......................... 10 2012 210 049

(51) Int. Cl.
*B81C 3/00* (2006.01)
*B81B 7/00* (2006.01)
*B81B 7/02* (2006.01)
*B81C 1/00* (2006.01)
*B81B 3/00* (2006.01)

(52) U.S. Cl.
CPC ........... *B81B 3/0018* (2013.01); *B81C 1/00238* (2013.01); *B81C 1/00246* (2013.01); *B81C 1/00261* (2013.01); *B81C 2203/0735* (2013.01); *B81C 2203/0771* (2013.01); *B81C 2203/0785* (2013.01)

(58) Field of Classification Search
CPC .................. H01L 21/8221; H01L 2924/1461; B81C 1/00246; B81C 2203/0109; B81C 2203/0735; B81C 2203/0785; B81C 1/00238; B81C 1/0023; B81C 2203/0771; B81C 1/00269; B81B 7/0035; B81B 7/007; B81B 7/0074; B81B 7/0077; B81B 7/008; B81B 7/02

See application file for complete search history.

(56) References Cited

U.S. PATENT DOCUMENTS

| | | | |
|---|---|---|---|
| 8,232,614 B1 * | 7/2012 | Chu et al. ...................... 257/414 |
| 2006/0161363 A1 * | 7/2006 | Shibasaki et al. ............... 702/94 |
| 2011/0049652 A1 * | 3/2011 | Wu et al. ....................... 257/417 |
| 2011/0156178 A1 * | 6/2011 | Zuniga-Ortiz et al. ........ 257/415 |
| 2011/0180943 A1 * | 7/2011 | Claes et al. .................... 257/787 |
| 2011/0265574 A1 * | 11/2011 | Yang .............................. 73/658 |
| 2012/0001276 A1 * | 1/2012 | Huang et al. .................. 257/416 |
| 2012/0001277 A1 * | 1/2012 | Park et al. ..................... 257/418 |
| 2012/0074590 A1 * | 3/2012 | Lin et al. ....................... 257/777 |
| 2012/0087521 A1 * | 4/2012 | Delaus et al. ................. 381/174 |
| 2012/0098122 A1 * | 4/2012 | Yang ............................. 257/737 |
| 2012/0160027 A1 * | 6/2012 | Hsu et al. ................... 73/504.08 |
| 2012/0267773 A1 * | 10/2012 | Ebefors et al. ................ 257/692 |

(Continued)

*Primary Examiner* — Laura Menz
*Assistant Examiner* — Maliheh Malek
(74) *Attorney, Agent, or Firm* — Kenyon & Kenyon LLP (57) ABSTRACT

An expansion of the functional scope of a hybrid integrated component including an MEMS element, a cap for the micromechanical structure of the MEMS element, and an ASIC element having circuit components is provided. In this component, the circuit components of the ASIC element interact with the micromechanical structure of the MEMS element. The MEMS element is mounted on the ASIC element in such a way that the micromechanical structure of the MEMS element is situated in a cavity between the cap and the ASIC element. The ASIC element is additionally equipped with the circuit components of a magnetic sensor system. These circuit components are produced in or on the CMOS back-end stack of the ASIC element. The magnetic sensor system may thus be implemented without enlarging the chip area.

12 Claims, 12 Drawing Sheets

(56) References Cited

U.S. PATENT DOCUMENTS

| | | | |
|---|---|---|---|
| 2013/0127879 A1* | 5/2013 | Burns et al. | 345/501 |
| 2013/0168740 A1* | 7/2013 | Chen | 257/254 |
| 2013/0249064 A1* | 9/2013 | Yamazaki et al. | 257/660 |
| 2013/0270658 A1* | 10/2013 | Behrendt et al. | 257/415 |
| 2013/0277774 A1* | 10/2013 | Frey et al. | 257/415 |
| 2013/0285165 A1* | 10/2013 | Classen et al. | 257/415 |
| 2013/0334621 A1* | 12/2013 | Classen et al. | 257/415 |
| 2014/0042562 A1* | 2/2014 | Chu et al. | 257/415 |
| 2014/0054730 A1* | 2/2014 | Graham et al. | 257/415 |
| 2014/0077796 A1* | 3/2014 | Schatz et al. | 324/244 |
| 2014/0110800 A1* | 4/2014 | Classen et al. | 257/415 |
| 2014/0117475 A1* | 5/2014 | Classen et al. | 257/418 |
| 2014/0217615 A1* | 8/2014 | Kuisma | 257/777 |
| 2014/0339654 A1* | 11/2014 | Classen | 257/415 |

* cited by examiner

HYBRID INTEGRATED COMPONENT AND METHOD FOR THE MANUFACTURE THEREOF

FIELD OF THE INVENTION

The present invention relates to a hybrid integrated component including an MEMS (micro-electromechanical system) element, a cap for the micromechanical structure of the MEMS element, and an ASIC (application-specific integrated circuit) element having circuit components, which interact with the micromechanical structure of the MEMS element. The MEMS element is mounted on the ASIC element, so that the micromechanical structure of the MEMS element is situated in a cavity between the cap and the ASIC element. Furthermore, the present invention relates to methods for manufacturing such a hybrid integrated component.

BACKGROUND INFORMATION

Components having MEMS elements have been manufactured in mass production for many years for greatly varying applications, for example, in the field of automotive technology and consumer electronics. The miniaturization of the components is increasingly gaining significance. On the one hand, the miniaturization substantially contributes to reducing the manufacturing costs of the components and therefore also the terminal equipment. On the other hand, in particular in the field of consumer electronics, more and more functions—and therefore components—are to be accommodated in terminal equipment, while the terminal equipment itself becomes smaller and smaller. Therefore, less and less space is available for the individual components on the application printed circuit boards.

Various miniaturization concepts for sensor components are known from practice, which provide an integration of the micromechanical sensor function and the circuitry-wise processing and analysis of the sensor signals in one component. In addition to the lateral integration of the MEMS function and the ASIC function on a shared chip, there are also already concepts for so-called vertical hybrid integration, according to which a chip stack is formed from ASIC, MEMS, and a cap wafer.

Such a vertically integrated component and a method for the manufacture thereof are described in US 2011/0049652 A1. The known method provides bonding the starting substrate for the MEMS element on an already processed ASIC substrate. A micromechanical structure, which includes at least one deflectable structural element, is only produced in the MEMS substrate thereafter. Independently thereof, a cap wafer is structured and prepared for the mounting above the micromechanical structure of the MEMS substrate and on the ASIC substrate. The cap wafer thus processed is bonded, after the structuring of the MEMS substrate, on the ASIC substrate, so that the micromechanical structure is enclosed in a hermetically sealed way between the ASIC substrate and the cap wafer.

The component described in US 2011/0049652 A1 is equipped with a capacitor system which—depending on the MEMS function—may be used for activating, i.e., moving the deflectable structure element, or may also be used for detecting externally caused deflections of the structural element. For this purpose, the capacitor system includes at least one deflectable electrode, which is located here on the deflectable structural element of the MEMS element, and stationary electrodes, which are implemented here in a structured metal layer on the surface of the ASIC substrate.

The known component concept allows cost-effective mass production of robust components having a micromechanical function and a signal processing circuit, since here not only the individual component parts—MEMS element, cap, and ASIC—are manufactured in the wafer composite, but rather also their mounting to form one component is implemented on the wafer level. The MEMS functions and the ASIC functions may be tested on the wafer level, and even the calibration of the individual components may take place on the wafer level before the separation. In addition, the known components require a comparatively small mounting surface because of the stacked construction, which has a favorable effect on the manufacturing costs of the terminal equipment.

SUMMARY

The present invention provides a reasonable expansion of the scope of the function of a component of the type mentioned at the outset, the supplementary functions of the component not requiring any enlargement of the chip area.

For this purpose, the ASIC element of the component is also additionally equipped with the circuit components of a magnetic sensor system within the scope of the preprocessing. The preprocessing of the ASIC element is generally a CMOS processing, in the case of which circuit elements are integrated into an ASIC substrate. A CMOS back-end stack is then produced on the ASIC substrate for the wiring of these circuit elements. According to the manufacturing method of the present invention, the circuit components of the magnetic sensor system are implemented in the layered structure of the CMOS back-end stack.

It has been found according to the present invention that the circuit functions of the ASIC element do not have to be restricted within the scope of the known component concept to signal processing for the MEMS element, but rather the ASIC element may additionally be equipped with an independent sensor function. This sensor function is implemented within the scope of the preprocessing of the ASIC element or substrate and must therefore only have limited compatibility with respect to processing with the micromechanical processing of the MEMS substrate and the APT (assembly and packaging technology) of the component. The present invention utilizes the fact that a magnetic sensor system may be implemented very well in a layered structure. The deposition and structuring processes required for this purpose may be integrated easily into the process sequence for manufacturing a CMOS back-end stack on the ASIC substrate.

The component concept under discussion here, which is expanded according to the present invention, is particularly well-suited for equipping sensors which operate in a contactless way, for example, inertial sensors, with an additional compass function. In particular, three-axis acceleration sensors and three-channel yaw rate sensors and also so-called inertial measurement units (IMUs), which combine the two above-mentioned sensor functions, are of great economic significance here. In the case of an inertial sensor, the micromechanical sensor structure of the MEMS element includes at least one resiliently suspended seismic mass, which is deflected due to accelerations. These accelerations may also be induced by centrifugal forces or rotational movements. Since approximately the entire chip area of the MEMS element is available for the micromechanical sensor structure, very large seismic masses may be implemented here on a comparatively small component footprint, which has a favorable effect on the measuring sensitivity.

The micromechanical sensor structure is capped. On the one hand, corruption of the measuring signal by environmental influences is thus prevented. On the other hand, the sensor structure is thus protected from damage by contaminants, moisture, and particles. In the case of a hermetically sealed cap of the sensor structure, defined pressure conditions may additionally be created for the sensor structure, in order to thus optimize the damping behavior of the sensor.

The essential circuit parts for the processing and analysis of the measuring signals may advantageously be integrated on the ASIC element, so that the MEMS sensor element and the ASIC element form a functional unit in this regard.

The equipping according to the present invention of the ASIC element with an additional magnetic sensor system represents a supplementation of the functional scope of an inertial sensor component, which is reasonable with respect to measuring technology and cost-effectiveness.

Fundamentally, there are various possibilities for implementing a magnetic sensor system within the scope of the present invention. As already mentioned, variants which may be implemented in a layered structure are preferable.

In one first specific embodiment, the ASIC element is equipped with at least one additional, preferably three-dimensional, Hall element. In this simplest case, no modification of the CMOS processing of the ASIC element is necessary, since such a Hall element may be structured out of the functional levels of the CMOS process.

If the magnetic sensor system is implemented on the ASIC element in the form of at least one AMR (anisotropic magnetoresistivity) or GMR (giant magnetoresistance) element, a special magnetic thin-film process must be integrated into the manufacturing process of the CMOS back-end stack. Such layers are typically made of NiFe for AMR sensors. For GMR sensors, complex multiple layers, including freely rotatable and magnetically "pinned" layers, typically made of NiFe, CoFe, CoFeCr, and nonmagnetic intermediate layers, typically Cu, Ru, and anti-ferromagnetic layers, e.g., IrMn, PtMn are used.

In one third embodiment variant, the magnetic sensor system of the ASIC element is implemented in flux gate or flip core technology and also integrated into the CMOS back-end stack of the ASIC element. In this case, the CMOS back-end stack of the ASIC element includes at least one layer made of a remagnetizable, in particular soft magnetic material, for example, a nickel-iron alloy. In addition, in the metal levels of the CMOS back-end stack, at least one exciter coil for remagnetizing this layer and at least one measuring coil for detecting the magnetic flux thus generated are implemented. Since the flux change is not only determined by the magnetization curve of the soft magnetic layer, but rather also by the external magnetic field, the external magnetic field may be ascertained in this way.

A first structure variant of the component according to the present invention requires three substrates, an ASIC substrate, an MEMS substrate, and a cap wafer, and accordingly two mounting steps. The micromechanical structure of the MEMS element extends here over the entire thickness of the MEMS substrate. The cap wafer is mounted above the micromechanical structure on the MEMS element or on the ASIC element. This structure variant is suitable in particular for sensor applications. Since the sensor structure extends over the entire thickness of the MEMS substrate, particularly large seismic masses may be implemented on a comparatively small chip area.

The second structure variant only requires two substrates, an ASIC substrate and an MEMS substrate, which are processed independently of one another, and accordingly only one mounting step. The micromechanical structure of the MEMS element is implemented here in a layered structure on a base substrate, before the MEMS element is mounted face down on the already processed ASIC substrate. In this case, the micromechanical structure of the MEMS element is situated in a cavity between the base substrate of the MEMS element and the ASIC element, so that the base substrate of the MEMS element functions as a cap for the micromechanical structure of the MEMS element. Components having a comparatively low structural height may be implemented using this second structure variant.

DETAILED DESCRIPTION

Figure 1A:
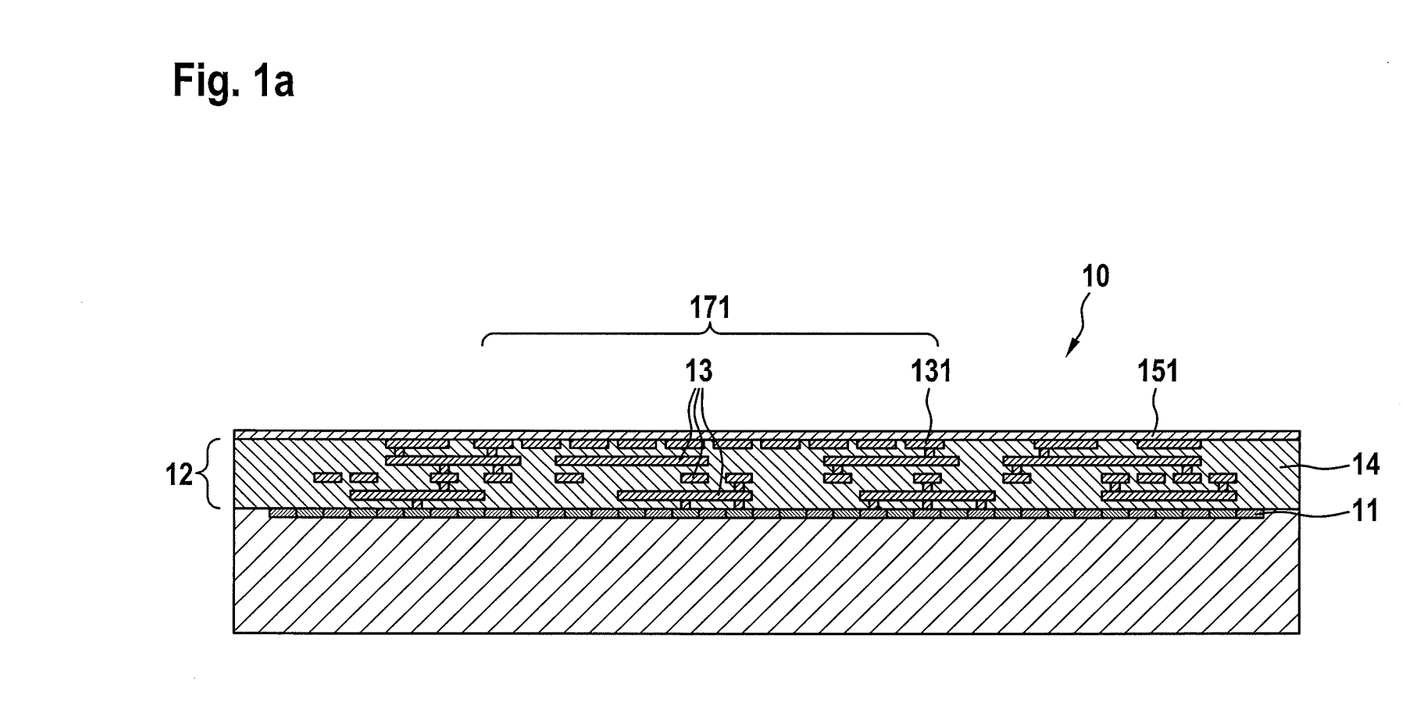
FIGS. 1a through 1g show the manufacturing of an inertial sensor component 100 according to the present invention having an integrated magnetic sensor system according to a first method variant on the basis of schematic sectional views.

In the case of the two method variants, which are described hereafter in conjunction with FIGS. 1a through 1g and 3a through 3d, for manufacturing a hybrid integrated component including an MEMS element, a cap for the micromechanical structure of the MEMS element, and an ASIC element, the ASIC substrate is processed independently from the remaining component parts. Circuit elements 11 are integrated into ASIC substrate 10 in a CMOS process. These circuit elements 11 are advantageously at least parts of a signal processing and analysis circuit for the MEMS sensor function of the component to be manufactured. However, MEMS-independent circuit functions may also be integrated into ASIC substrate 10 within the scope of the CMOS processing. For the internal component electrical wiring of circuit elements 11, a CMOS back-end stack 12 is then produced on the processed surface of ASIC substrate 10. This is a layered structure having multiple circuit levels in the form of structured metal levels 13, which are each electrically insulated by at least one insulating layer 14 from one another or from ASIC substrate 10. Since the insulating layers in the exemplary embodiment described here are each an oxide layer, the insulating layers are not described in detail here, but rather are designated as a single insulating layer 14, in which structured metal levels 13 are embedded. Lower sections 171 of two coil elements arranged one inside the other, which are part of a magnetic sensor system, are implemented in uppermost metal level 131 of the CMOS back-end stack. In the standard CMOS process, CMOS back-end stack 12 is finally provided with a passivation layer 151 to protect uppermost metal level 131, as shown in FIG. 1a.

Figure 1B:
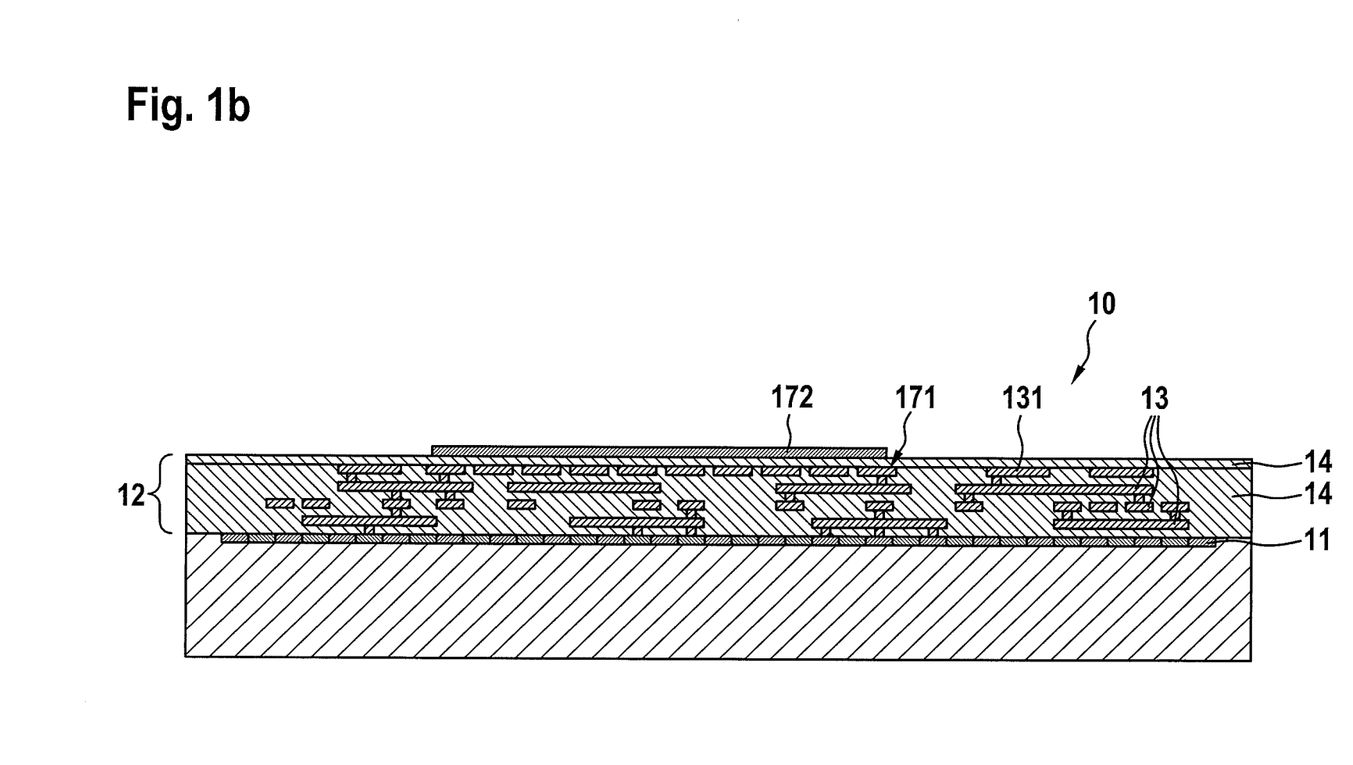

According to the present invention, either this passivation layer 151 is omitted or passivation layer 151 is removed again, in order to apply other circuit components of a magnetic sensor system to CMOS back-end stack 12. In the exemplary embodiment described here, for this purpose a further oxide layer is initially produced as an insulating layer 14 above uppermost metal level 131. Over this insulating layer, a layer made of a magnetizable material, for example, a nickel-iron alloy, is then produced, from which a layer area 172 is structured out, which is shown in FIG. 1b.

Figure 1C:
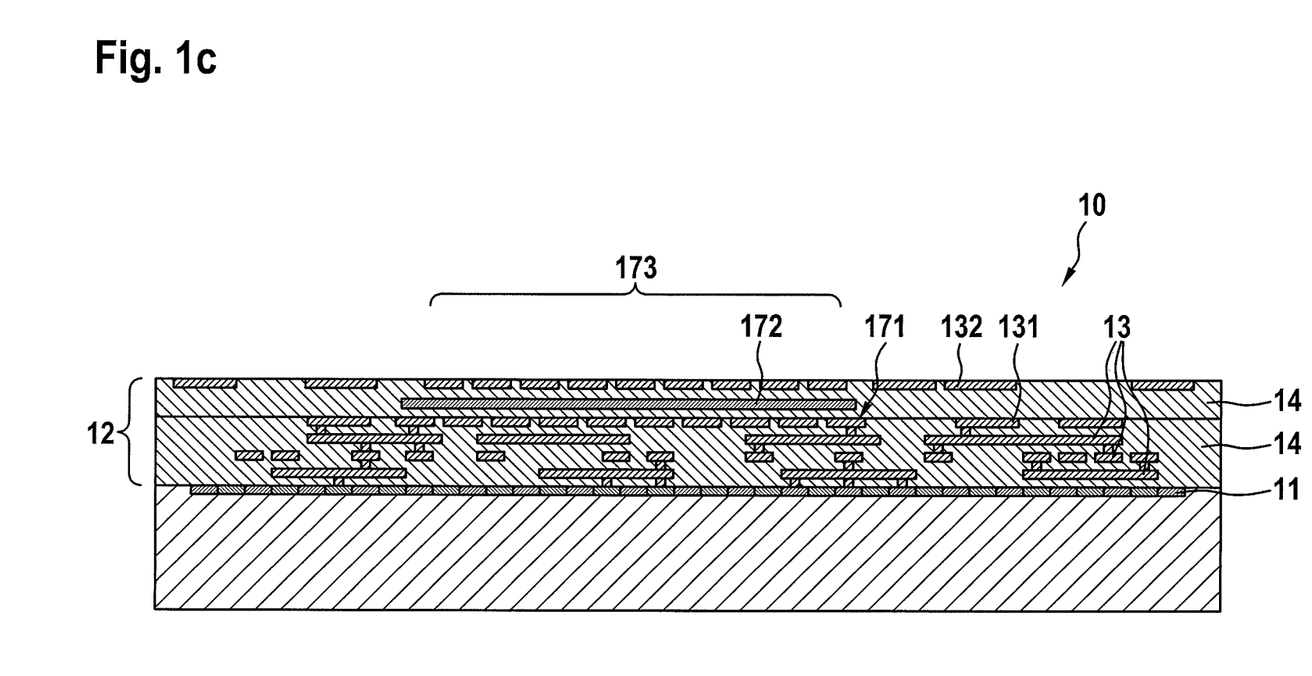

FIG. 1c shows ASIC substrate 10 having the layered structure of CMOS back-end stack 12 after deposition and planarization of a further oxide layer 14 as an insulating layer and a further metal level 132, out of which upper section 173 of the two coil elements situated one inside the other were structured. These upper sections 173 are situated offset to lower sections 171 and are connected via metallized contact openings (not shown here) in interposed insulating layers 14, so that layer area 172 forms a coil core for the two coil elements thus produced. One of the two coil elements is used as the exciter coil, using which this coil core 172 is intentionally magnetized or remagnetized. The other coil element functions as a measuring coil, using which the change of the magnetic flux is detected. Since this change is dependent on the external magnetic field, the layered structure, including original uppermost metal level 131 having lower coil sections 171, the magnetizable layer having coil core 172, and further metal level 132, which is now uppermost, having upper coil sections 173, forms a magnetic sensor system. Interposed insulating layers 14 are used for electrically decoupling these parts.

Figure 1D:
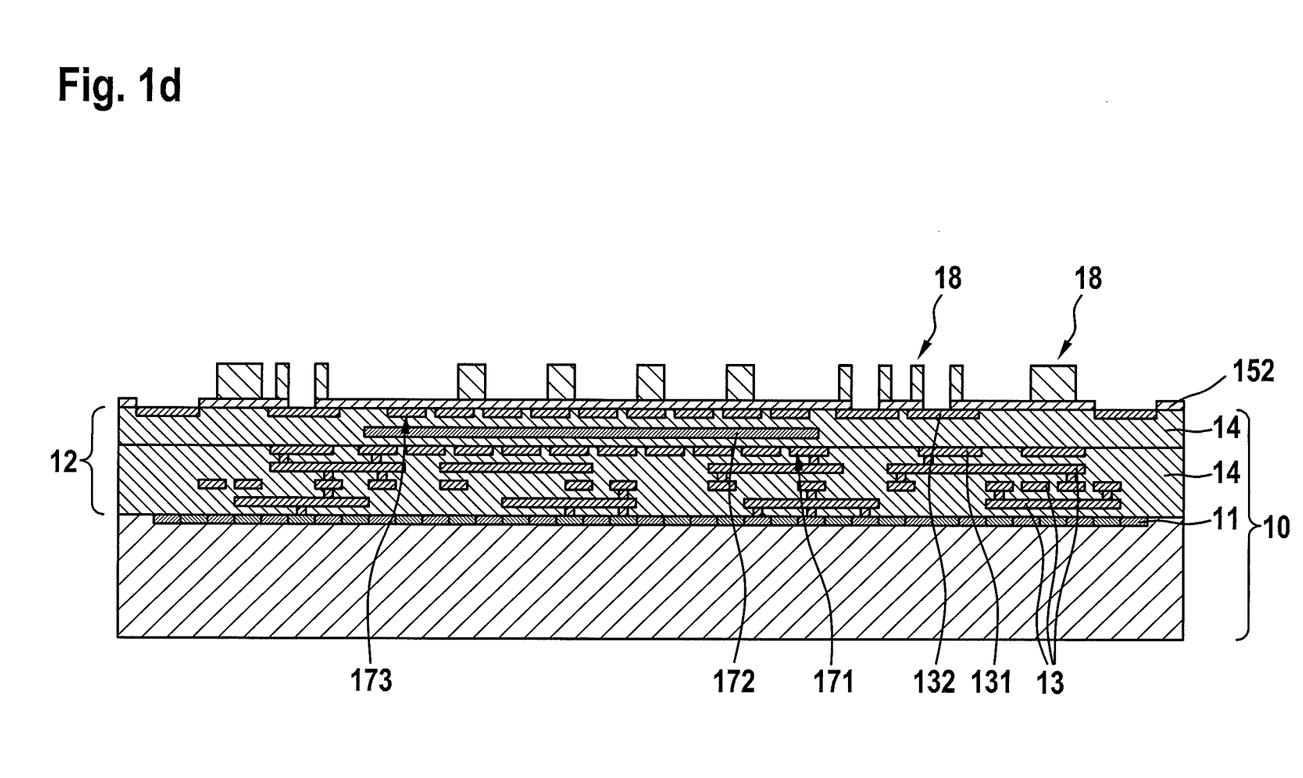

After the implementation of the magnetic sensor system on or in the layered structure of CMOS back-end stack 12, it is provided with a passivation layer 152, which is structured in order to allow electrical contacting of circuit level 132, which is now uppermost, of CMOS back-end stack 12 and therefore also of circuit elements or functions 11 of ASIC substrate 10. In the present exemplary embodiment, a standoff structure 18 is then produced for the mounting of an MEMS substrate. For this purpose, for example, an oxide layer 18 is deposited on CMOS back-end stack 12 above structured passivation layer 152 and structured in a suitable way. FIG. 1d shows the result of this structuring process.

Structured oxide layer 18 forms the mounting surface for an unstructured MEMS substrate 20. The connection between MEMS substrate 20 and ASIC substrate 10 is established here in a plasma-activated direct bonding method and is hermetically sealed. Relatively thick MEMS substrate 20 is now thinned until its thickness approximately corresponds to the intended structural height of the MEMS element. This structural height is typically in a range between 10 µm and 150 µm. Only in combination with ASIC substrate 10 is MEMS substrate 20 structured. This structuring takes place here in two steps.

Figure 1E:
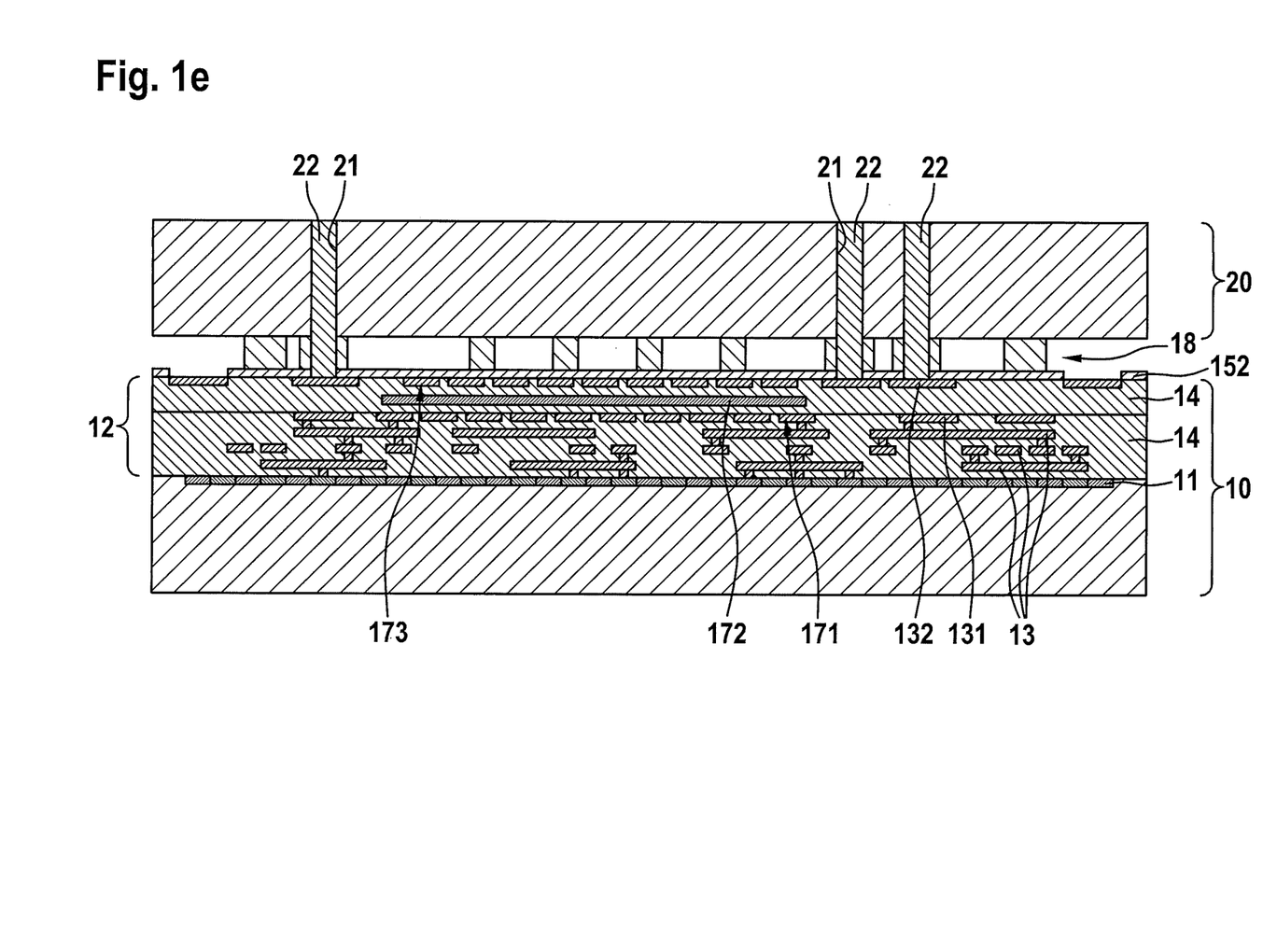

The first structuring step is used to produce through contacts, so-called vias 22, between MEMS substrate 20 and ASIC substrate 10. Passage openings 21 having an essentially circular cross section are produced in MEMS substrate 20, which merge into openings in standoff structure 18, specifically where passivation layer 152 was opened for the electrical contacting of ASIC substrate 10. Passage openings 21 typically have an aspect ratio of 5:1 to 20:1 and extend over the entire thickness of MEMS substrate 20. The walls of these passage openings 21 are typically coated using a conductive diffusion barrier, for example, titanium nitride or titanium tungsten, before they are completely or partially filled in a deposition process with an electrically conductive material 22, for example, copper or tungsten. FIG. 1e shows ASIC substrate 10 with MEMS substrate 20 after the filling of passage openings 21 and after the conductive material deposited in this case on the surface of MEMS substrate 20 has been removed again. FIG. 1e illustrates the function of standoff structure 18 as a distance holder between the closed surface of ASIC substrate 10 and MEMS substrate 20.

Figure 1F:
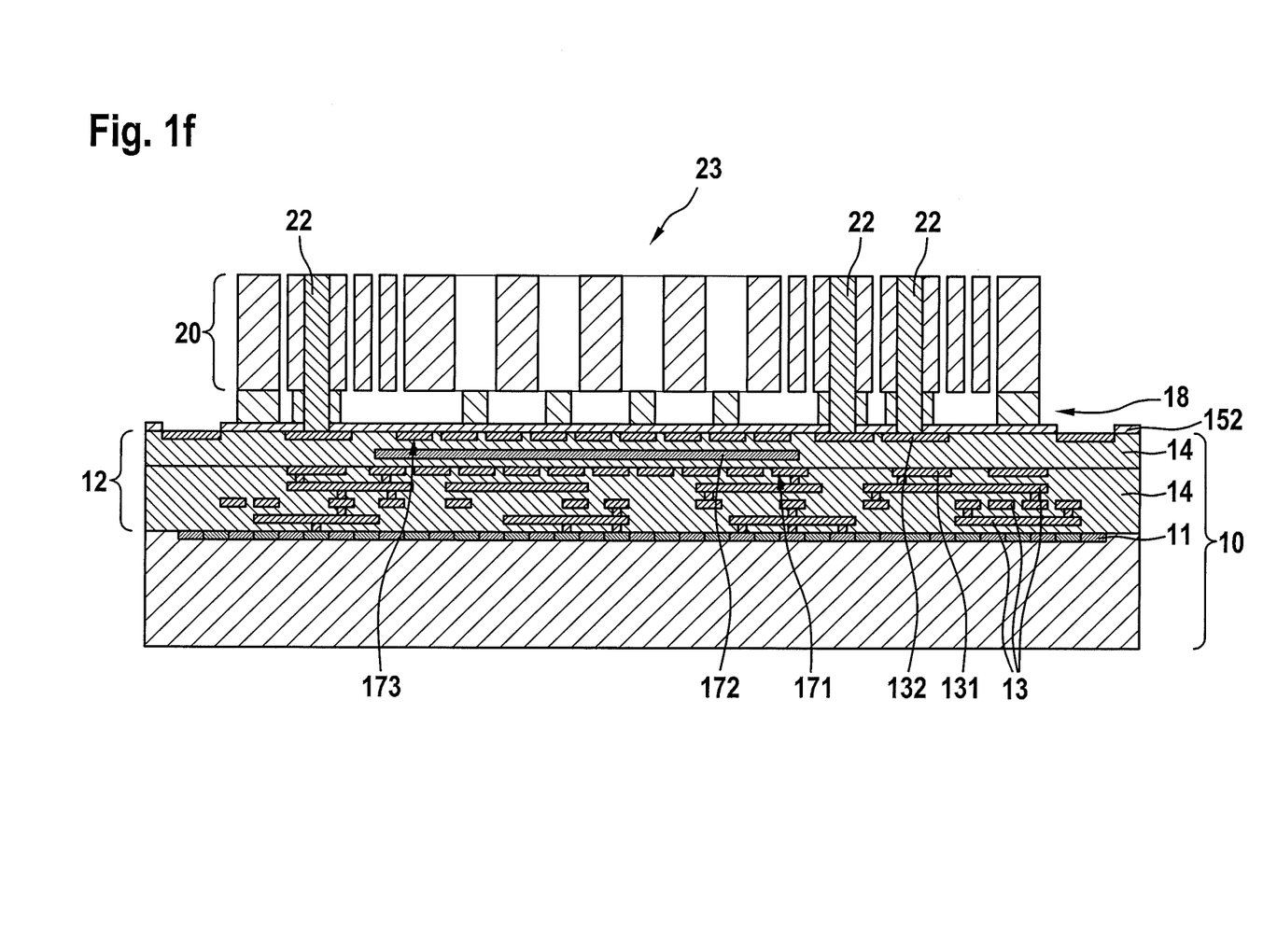

Micromechanical structure 23 of the MEMS element is only produced and exposed in the second structuring step. It extends over the entire thickness of MEMS substrate 20, as shown in FIG. 1f, and includes the seismic mass of an inertial sensor. A trenching process is preferably used both for the first structuring step and for the second structuring step, since structures having a particularly high aspect ratio may be produced using this method.

Figure 1G:
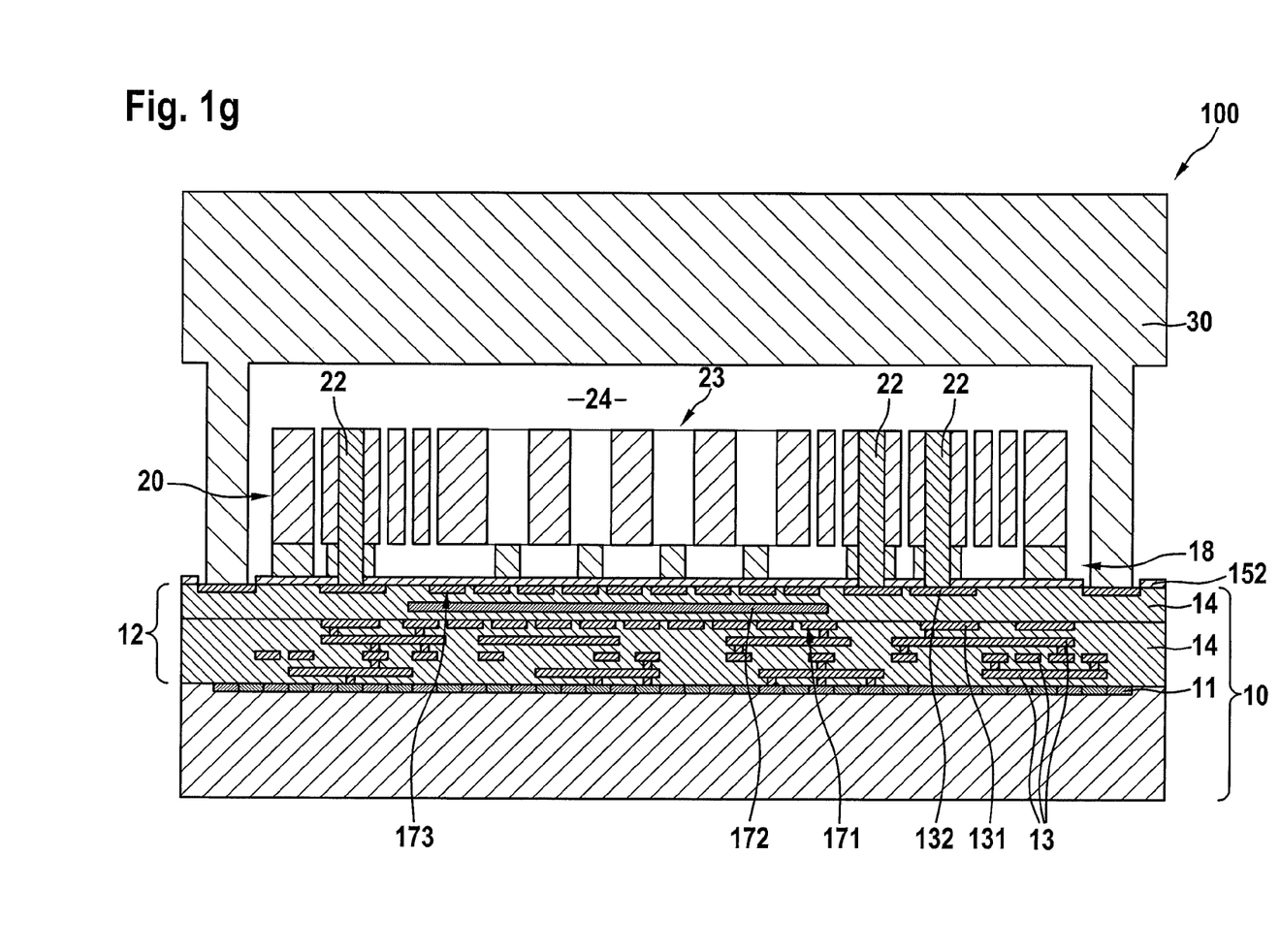

A prestructured cap wafer 30 is then mounted above sensor structure 23 of MEMS element 20, in order to close it in a hermetically sealed way and under defined pressure conditions from the measuring environment. As shown in FIG. 1g, cap wafer 30 is connected in the present exemplary embodiment to ASIC substrate 10, so that MEMS element 20 is completely situated in cavity 24 between ASIC substrate 10 and cap wafer 30. The connection between the cap wafer and the ASIC substrate is established in a bonding method, preferably by eutectic bonding. Alternatively, the cap wafer may also be mounted above the sensor structure on the MEMS substrate. In any case, the mounting of the cap wafer takes place even before the separation of components 100, which are detached from the wafer composite by sawing, for example.

Figure 2:
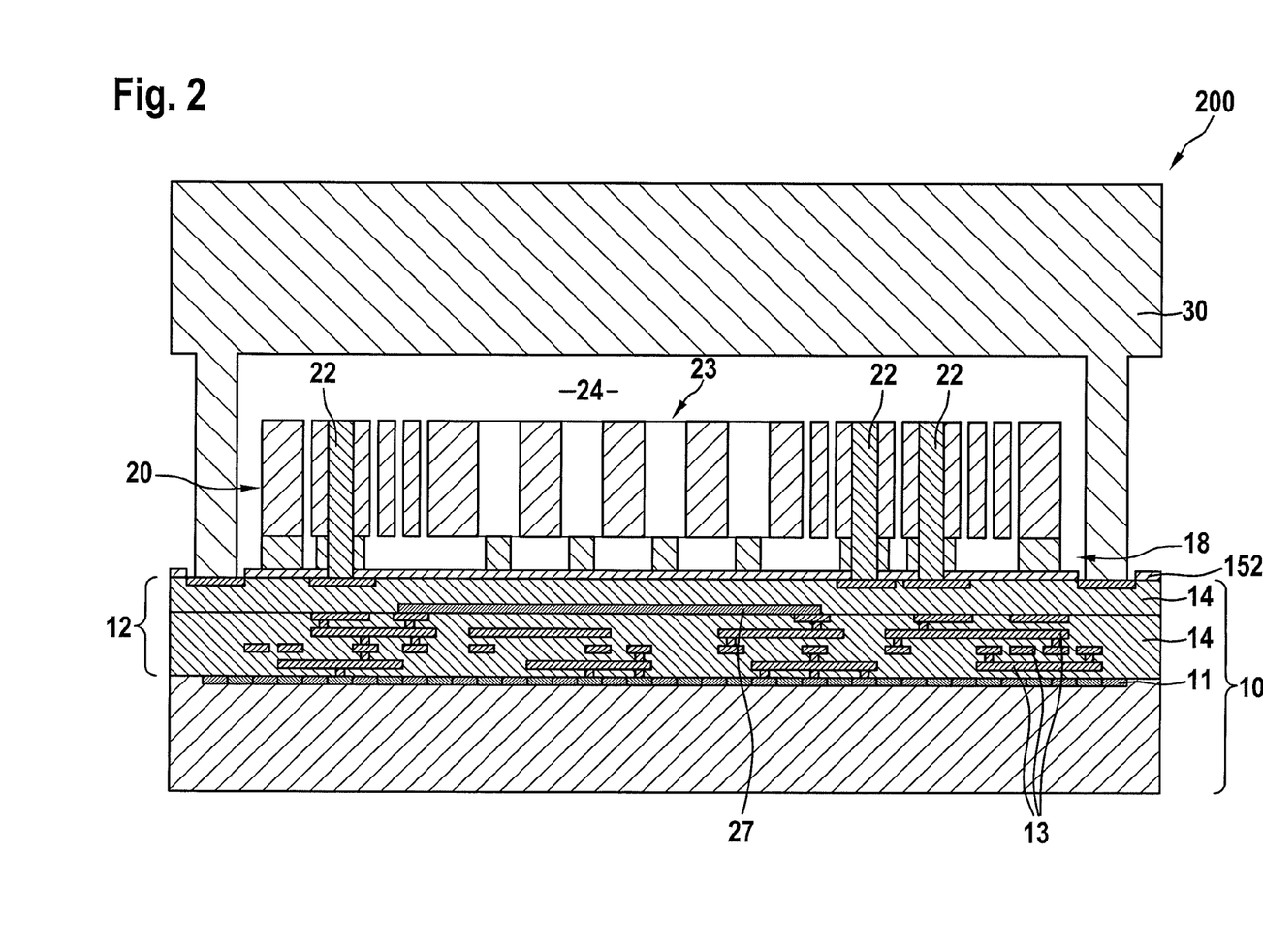
FIG. 2 shows a schematic sectional view of a second inertial sensor component 200 according to the present invention, which only differs from inertial sensor component 100 in the implementation of the magnetic sensor system.

Component 200 shown in FIG. 2 differs from component 100 shown in FIG. 1g only in the implementation of the magnetic sensor system in CMOS back-end stack 12. Therefore, the following explanations are restricted to the magnetic sensor system of component 200. Reference is made to the description of FIGS. 1a through 1g with respect to the remaining component parts.

As in the case of component 100, ASIC substrate 10 of component 200 was CMOS processed and provided with a CMOS back-end stack 12 for the internal component electrical wiring of integrated circuit elements 11. In contrast to component 100, however, an AMR or GMR layer was deposited here above uppermost metal level 131 of CMOS back-end stack 12, out of which an AMR element or a GMR element 27 was then structured. AMR or GMR element 27 is embedded here in insulating layer 14 of CMOS back-end stack 12 and may be electrically contacted via metal levels 131 and 13 of the CMOS back-end stack. The electrical resistance of the element changes as a function of the external magnetic field. This resistance change is detected to thus ascertain the applied external magnetic field.

The second method variant described hereafter for manufacturing a hybrid integrated component 300 including an MEMS element, a cap for the micromechanical structure of the MEMS element, and an ASIC element proceeds from only two semiconductor substrates, namely an ASIC substrate 10 and an MEMS substrate 40, which are processed independently of one another. The processing of ASIC substrate 10 of component 300 corresponds here to the processing of ASIC substrate 10 of component 100. Therefore, reference is made for this purpose to the explanations of FIGS. 1a through 1c. It is essential that a magnetic sensor system is implemented on or in CMOS back-end stack 12 of ASIC substrate 10.

Figure 3A:
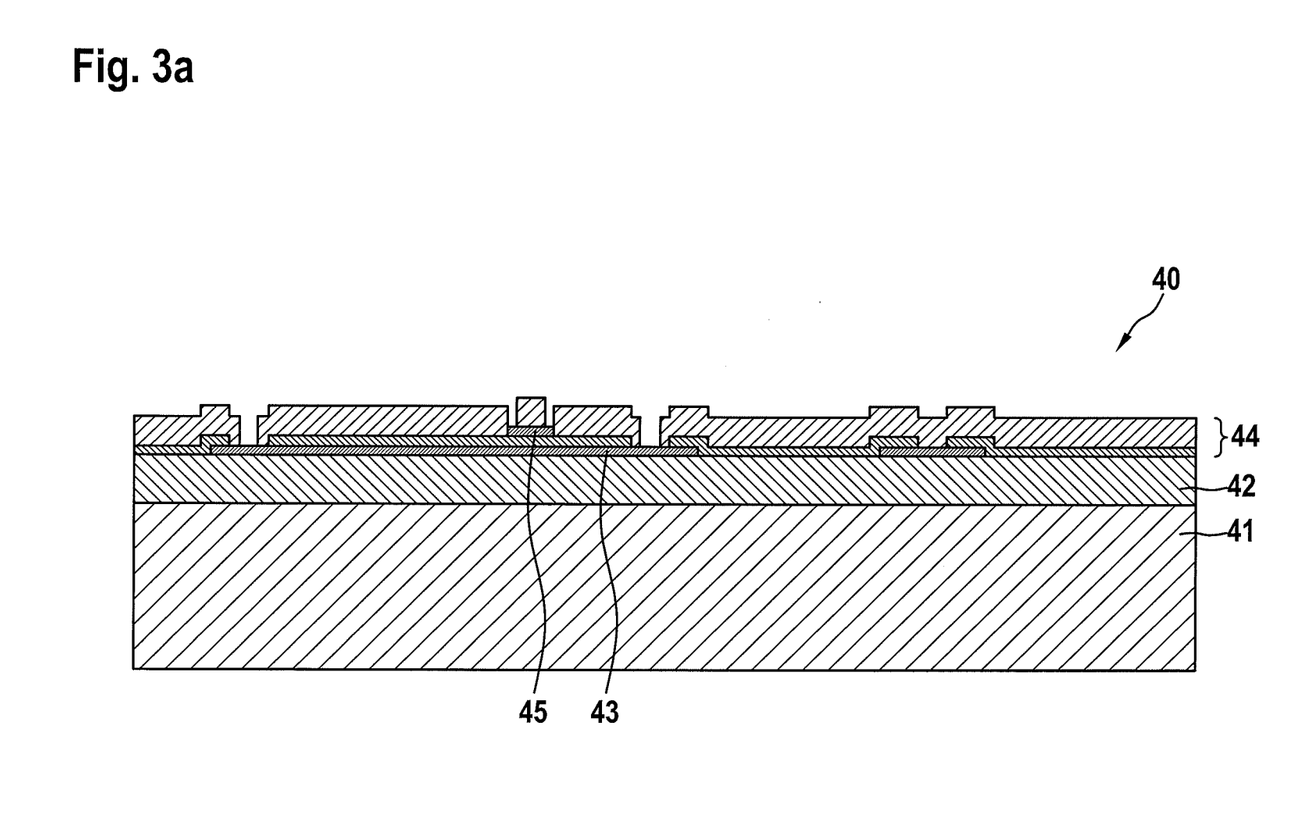
FIGS. 3a through 3d show the manufacturing of a third inertial sensor component 300 according to the present invention having an integrated magnetic sensor system according to a second method variant on the basis of schematic sectional views.

MEMS substrate 40 is a single-crystal silicon wafer 41, on whose surface a first oxide layer 42 was initially applied for electrical insulation of silicon wafer 41 against the layered structure produced thereafter. This layered structure includes two polysilicon printed conductor levels 43 and 45 here, which are embedded in multiple structured oxide layers 44, as shown in FIG. 3a.

Figure 3B:
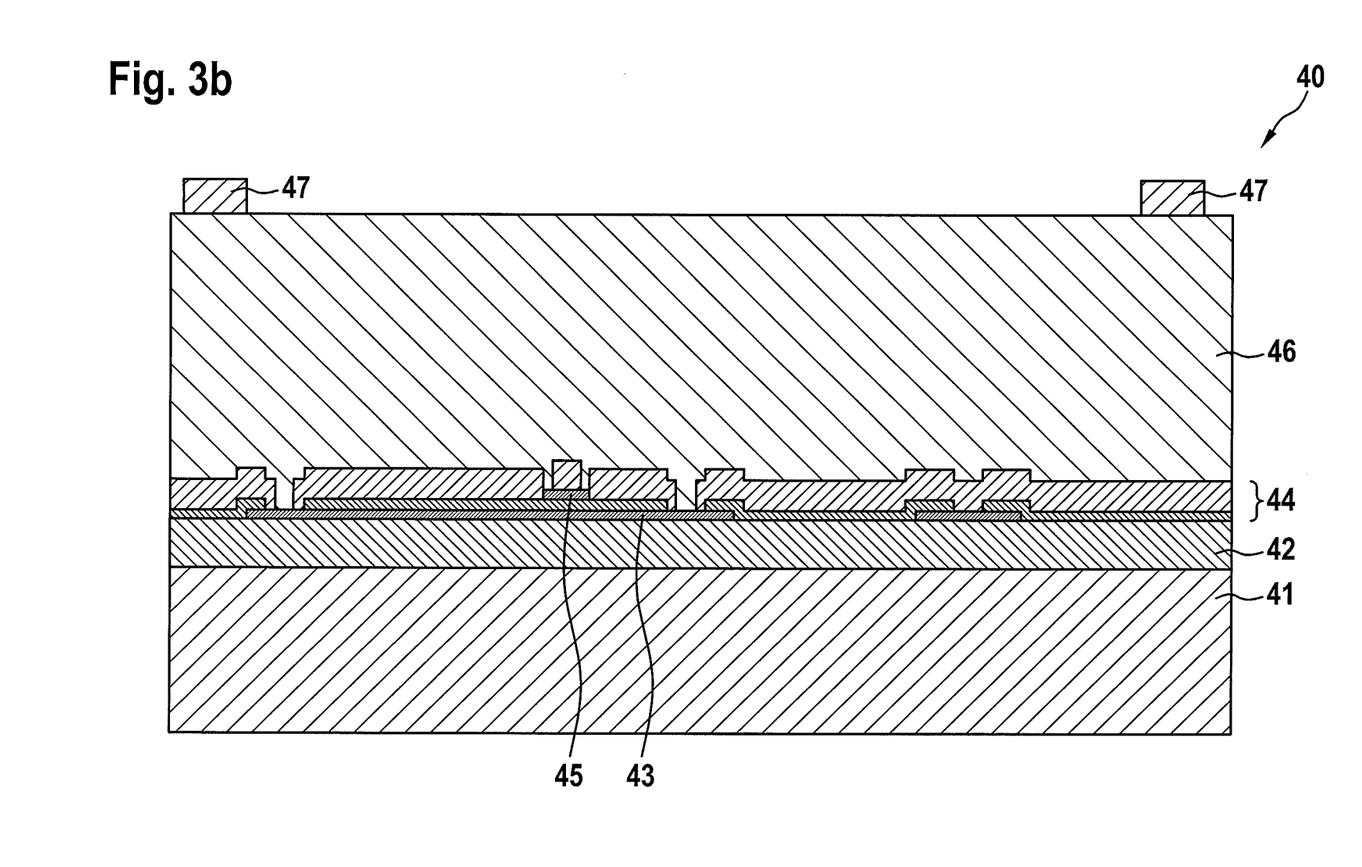

In a subsequent epitaxy process, a thick polycrystalline silicon functional layer 46 is deposited on structured oxide layer 44. FIG. 3b shows the layered structure, after bonding areas 47 have been produced on functional layer 46, which are subsequently used for the mounting of the MEMS substrate on processed ASIC substrate 10. Bonding areas 47 were structured out of a bonding layer, for example, a germanium layer.

Figure 3C:
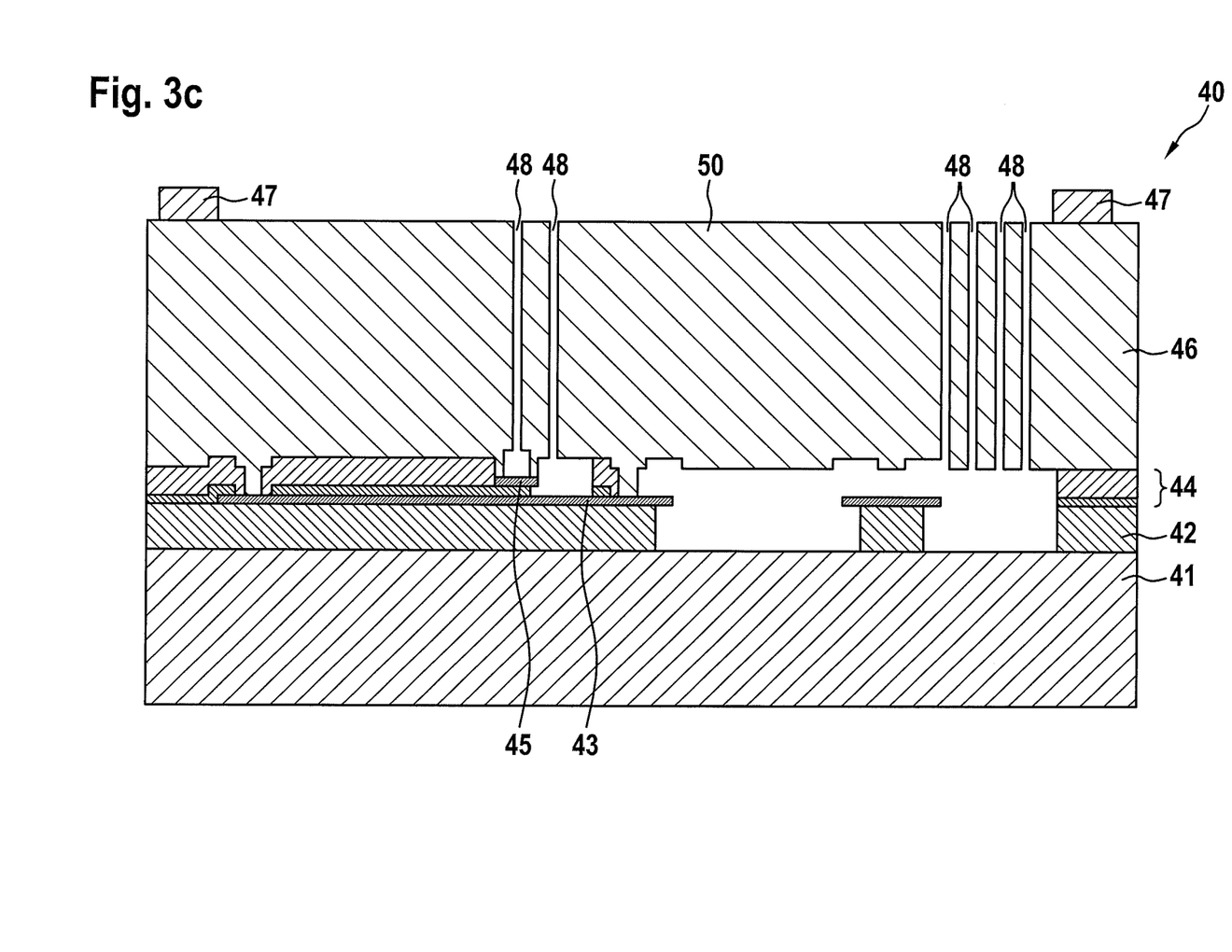

Micromechanical structure 50 of MEMS element 40 is then produced in a two-step method in functional layer 46 of MEMS substrate 40. Micromechanical structure 50 is initially defined and laterally exposed. This takes place in a trenching process, in which trenches 48 are produced, which extend over the entire thickness of functional layer 46 up to oxide layer 44. The material of oxide layers 42 and 44 below micromechanical structure 50 is then dissolved away, in order to also expose the micromechanical structure in the vertical direction. This takes place in a sacrificial layer etching process via trenches 48. Micromechanical structure 50 thus exposed is shown in FIG. 3*c*.

Figure 3D:
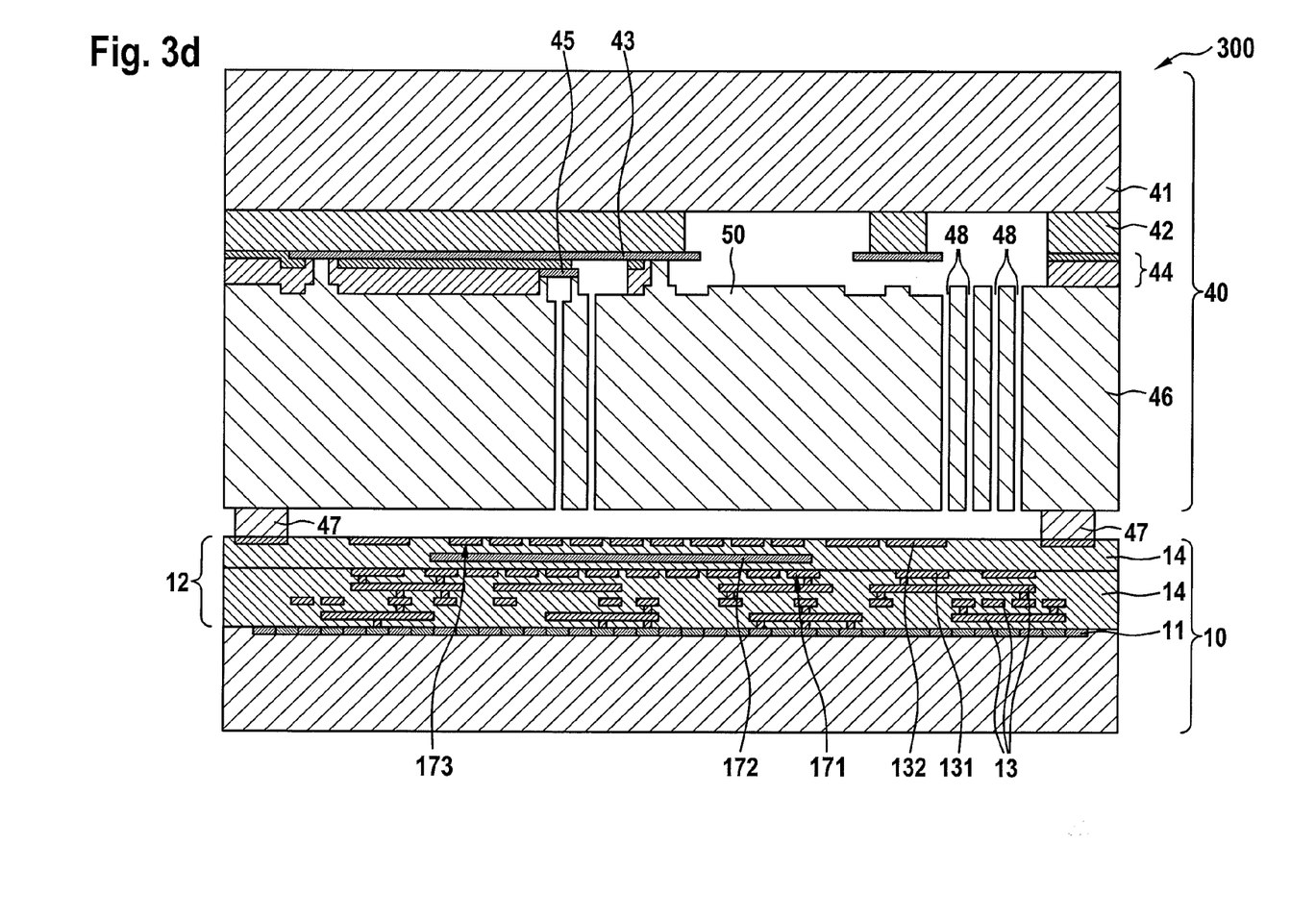

MEMS substrate 40 thus processed is now bonded on ASIC substrate 10, which is processed independently thereof, namely face down, i.e., with structured functional layer 46 on CMOS back-end stack 12. In addition to the mechanical connection between ASIC substrate 10 and MEMS substrate 40, electrical connections may also be established. FIG. 3*d* illustrates that bonding layer 47 functions as a standoff structure between ASIC substrate 10 and MEMS substrate 40, and base substrate 41 of MEMS substrate 40 forms a cap for micromechanical structure 50 of component 300.

What is claimed is:

1. A hybrid integrated component, comprising:
an MEMS element;
a cap for a micromechanical structure of the MEMS element; and
an ASIC element including circuit components that interact with the micromechanical structure of the MEMS element,
wherein the MEMS element is mounted on the ASIC element so that the micromechanical structure of the MEMS element is situated in a cavity between the cap and the ASIC element, and
wherein the ASIC element includes:
circuit components of a magnetic sensor system, the circuit components including two coil elements arranged one inside the other, the two coil elements having upper sections and lower sections offset from each other; and
at least one remagnetizable layer area as a coil core for the two coil elements,
wherein one of the two coil elements is configured as at least one exciter coil for remagnetizing the coil core, and
wherein the other of the two coil elements is configured as at least one measuring coil for detecting a change of the magnetic flux thus caused.

2. The component as recited in claim 1, wherein the ASIC element includes at least one three-dimensional Hall element.

3. The component as recited in claim 1, wherein the ASIC element includes one of at least one AMR and at least one GMR element.

4. The component as recited in claim 1, wherein the micromechanical structure of the MEMS element extends over an entire thickness of a substrate of the MEMS element, and the cap is implemented as a cap wafer that is mounted above the micromechanical structure one of on the MEMS element and on the ASIC element.

5. The component as recited in claim 1, wherein the micromechanical structure of the MEMS element is implemented in a layered structure on a semiconductor substrate, the MEMS element is mounted face down on the ASIC element so that the micromechanical structure of the MEMS element is situated in a cavity between the semiconductor substrate of the MEMS element and the ASIC element, and the semiconductor substrate of the MEMS element functions as a cap for the micromechanical structure of the MEMS element.

6. The component as recited in claim 1, wherein the MEMS element includes an inertial sensor element, the ASIC element includes at least parts of a signal detection and analysis circuit for the inertial sensor element, and a compass function is implemented with the aid of the magnetic sensor system of the ASIC element.

7. The component as recited in claim 6, wherein the inertial sensor element includes at least one of a three-axis acceleration sensor and a three-channel yaw rate sensor.

8. A method for manufacturing hybrid integrated components including an MEMS element, a cap for a micromechanical structure of the MEMS element, and an ASIC element having circuit components that interact with the micromechanical structure of the MEMS element, comprising:
CMOS-processing an ASIC substrate and providing a CMOS back-end stack;
mounting an MEMS substrate on the CMOS back-end stack of the ASIC substrate;
for each component, producing at least one micromechanical structure in the MEMS substrate, the MEMS substrate extending over an entire thickness of the MEMS substrate;
mounting a cap wafer one of on the MEMS substrate and the ASIC substrate in such a way that a micromechanical structure of a component is situated in each case in a cavity between the cap wafer and the ASIC substrate;
separating the components only after the mounting of the cap wafer; and
implementing at least one circuit component of a magnetic sensor system in the CMOS back-end stack,
wherein the at least one circuit component of the magnetic sensor system includes two coil elements arranged one inside the other, the two coil elements having upper sections and lower sections offset from each other, and
wherein the ASIC element includes at least one remagnetizable layer area as a coil core for the two coil elements, wherein one of the two coil elements is configured as at least one exciter coil for remagnetizing the coil core, and wherein the other of the two coil elements is configured as at least one measuring coil for detecting a change of the magnetic flux thus caused.

9. A method for manufacturing hybrid integrated components including an MEMS element, a cap for a micromechanical structure of the MEMS element, and an ASIC element having circuit components that interact with the micromechanical structure of the MEMS element, comprising:
CMOS-processing an ASIC substrate and providing a CMOS back-end stack;
producing for each component at least one micromechanical structure in a layered structure on a base substrate of an MEMS substrate;
mounting the MEMS substrate face down on the CMOS back-end stack of the ASIC substrate;
only after the mounting, separating the components; and
implementing at least one circuit component of a magnetic sensor system in the CMOS back-end stack,
wherein the at least one circuit component of the magnetic sensor system includes two coil elements arranged one inside the other, the two coil elements having upper sections and lower sections offset from each other, and wherein the ASIC element includes at least one remagnetizable layer area as a coil core for the two coil elements, wherein one of the two coil elements is configured as at least one exciter coil for remagnetizing the coil core, and wherein the other of the two coil elements is configured as at least one measuring coil for detecting a change of the magnetic flux thus caused.

10. The method as recited in claim 9, further comprising:
implementing at least one Hall element in at least one level of the CMOS layer stack.

11. The method as recited in claim 10, further comprising:
accommodating one of at least one AMR layer and at least one GMR layer in a layered structure of the CMOS back-end stack; and
structuring the one of the at least one AMR layer and the at least one GMR layer to implement one of at least one AMR element and at least one GMR element.

12. The method as recited in claim 11, further comprising:
accommodating the at least one remagnetizable layer in the layered structure of the CMOS back-end stack;
structuring the remagnetizable layer to produce the remagnetizable layer area as the coil core;
in adjacent metal levels and insulating layers of the CMOS back-end stack, implementing the at least one exciter coil for remagnetizing the coil core; and
implementing the at least one measuring coil for detecting the change of the magnetic flux thus caused.

* * * * *